United States Patent [19]

Tsang

[11] Patent Number: 4,597,163
[45] Date of Patent: Jul. 1, 1986

[54] METHOD OF IMPROVING FILM ADHESION BETWEEN METALLIC SILICIDE AND POLYSILICON IN THIN FILM INTEGRATED CIRCUIT STRUCTURES

[75] Inventor: Juine-Kai Tsang, Sunnyvale, Calif.
[73] Assignee: Zilog, Inc., Campbell, Calif.
[21] Appl. No.: 684,677
[22] Filed: Dec. 21, 1984
[51] Int. Cl.[4] .................. H01L 21/263; H01L 21/265
[52] U.S. Cl. .................... 29/576 B; 29/571; 29/578; 148/1.5; 148/187; 148/DIG. 140; 357/91; 427/38
[58] Field of Search ............ 29/576 B, 571, 578; 148/1.5, 187; 357/91; 427/38

[56] References Cited

U.S. PATENT DOCUMENTS

| | | | |
|---|---|---|---|
| 4,180,596 | 12/1979 | Crowder et al. | 427/42 |
| 4,276,557 | 6/1981 | Levinstein et al. | 357/67 |
| 4,332,839 | 6/1982 | Levinstein et al. | 427/85 |
| 4,337,476 | 6/1982 | Fraser et al. | 357/67 |
| 4,373,251 | 2/1983 | Wilting | 29/571 |
| 4,411,734 | 10/1983 | Maa | 156/643 |
| 4,443,930 | 4/1984 | Hwang et al. | 29/571 |
| 4,446,476 | 5/1984 | Isaac et al. | 357/67 |
| 4,450,620 | 5/1984 | Fuls et al. | 29/571 |
| 4,457,972 | 7/1984 | Griffith et al. | 427/38 |
| 4,468,308 | 8/1984 | Scovell et al. | 204/192 R |
| 4,526,624 | 7/1985 | Tombrello et al. | 148/1.5 |

FOREIGN PATENT DOCUMENTS 0012684  1/1979  Japan .................. 148/1.5

OTHER PUBLICATIONS

Nagasawa et al., Jap. Jour. Appl. Phys. 22 (1983), L-57.
d'Heurle et al., Jour. Appl. Phys. 53 (1982), 8765.
Hallock et al., IBM—TDB, 26 (1984), 4337.
Vaidya et al., J. Vac. Sci. Technol., B-3 (1985), 846.

Primary Examiner—Upendra Roy
Attorney, Agent, or Firm—Majestic, Gallagher, Parsons & Siebert

[57] ABSTRACT

A method of improving film adhesion during the fabrication of thin film integrated circuits is disclosed. The method includes the steps of depositing a metallic silicide on a substrate and then implanting selected ions at predetermined doses and energies into the silicide layer, whereby tensile stress generated during fabrication processes is reduced. In one embodiment of the invention, the substrate is provided with a polycrystalline silicon layer and the silicide is of the structure $MSi_x$, where M is a refractory metal and x is greater than 2. Preferred doses range from $10^{15}$ to $10^{17}$ cm$^{-2}$, while preferred energies range from 40 to 150 keV.

9 Claims, 4 Drawing Figures

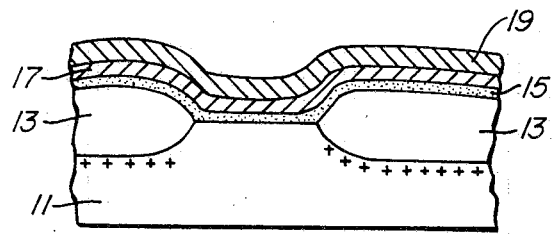
FIG._1.
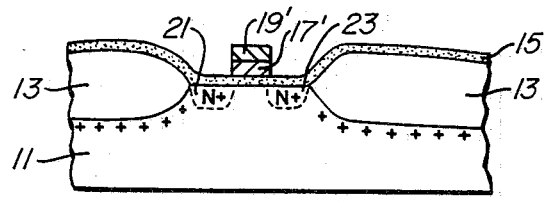
FIG._2.
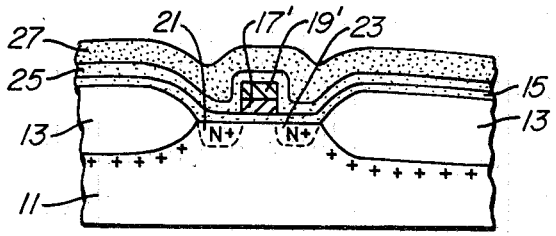
FIG._3.
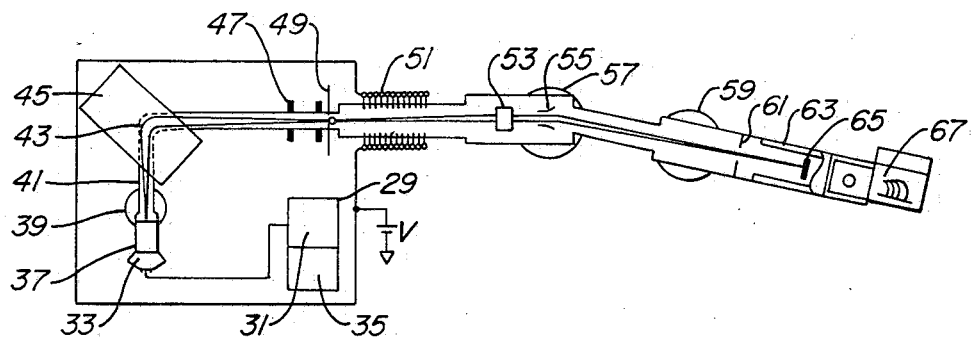
FIG._4.

METHOD OF IMPROVING FILM ADHESION BETWEEN METALLIC SILICIDE AND POLYSILICON IN THIN FILM INTEGRATED CIRCUIT STRUCTURES

FIELD OF THE INVENTION

The present invention relates generally to the field of integrated circuit fabrication, and more particularly relates to a method of improving film adhesion in thin film integrated circuit structures.

BACKGROUND OF THE INVENTION

The design and manufacture of semiconductor integrated circuits is well known in the art. With the many recent advances in integrated circuit technology, device dimensions are continuously decreasing while the packing density and complexity of these devices are correspondingly increasing. Coincident with these advances are also increasingly stringent requirements for electrical interconnection materials. Briefly, these requirements are low resistivity, the ability to withstand the chemicals and high temperatures used in fabrication processes, and the capability of being patterned into fine lines.

In a typical MOSFET structure, for example, an epitaxially grown single-crystal silicon layer provides a base or substrate, while polycrystalline silicon ("polysilicon") is the standard material for both gate and interconnect structures. The polysilicon is insulated from electrically conductive overlayers and the single crystal silicon substrate by layers of silicon dioxide. Although polysilicon provides the requisite stability to processing chemicals and high temperatures, a major limitation now restricting its utility as an interconnection material in high performance devices is its limited conductivity. Even heavily doped polysilicon has a conductivity of only about 300 micro-ohm-cm., thus imposing a serious limitation on circuit performance. One proposed solution has been to replace polysilicon with pure metals such as aluminum, tungsten or titanium, which have a conductivity far higher than that of polysilicon. However, these materials are also limited in that they may react with the silicon substrate at the high temperatures used in integrated circuit fabrication and may additionally be unable to withstand the chemical reagents used in processing.

An alternative solution has been the incorporation of refractory metal silicides into integrated circuit fabrication technology. Silicides offer several advantages over single-layer doped polysilicon. In contrast to doped polysilicon, which at a typical thickness of 4500 angstroms has a sheet resistivity of 15 ohms per sheet or more, silicides provide on the order of 2 ohms per sheet or less. Tantalum and tungsten silicides each have sheet resistivities of about 2 ohms per sheet, molybdenum silicide about 1.5 to about 2.0 ohms per sheet, and titanium silicide about 0.5 ohms per sheet. Silicides are also compatible with MOSFET and other integrated circuit fabrication processes as they can generally withstand high temperatures and caustic processing chemicals. Finally, providing there is sufficient silicon underlying the silicide layer, a self-passivating silicon dioxide layer can be thermally grown over the silicide without any degradation of chemical or electrical properties of the silicide film.

Metallic silicides provide the desired resistivity and the chemical and thermal stability necessary for use as interconnects, and they function well as FET gates. A layered structure having a polysilicon layer sufficiently thick to serve as a transistor gate, underlying the silicide, is often used. These "polycide" structures have resistivities on the order of 4 ohms per sheet or less where the combined thickness of both layers is about 4500 angstroms. The use of such polycide structures is fairly recent but is known in the art. U.S. Pat. No. 4,180,596 to Crowder et al., for example, discloses a method of providing a silicide layer on a polysilicon substrate by means of sputtering and subsequent annealing. U.S. Pat. No. 4,468,308 to Scovell et al. shows a method of providing a silicide layer on a semiconductor substrate using a vapor deposition technique. Other semiconductor circuit structures having silicide layers include those disclosed in the following: U.S. Pat. No. 4,276,557 to Levinstein et al., which shows a tantalum or titanium silicide layer sandwiched between a layer of doped polysilicon and a vapor-deposited layer of silicon dioxide; U.S. Pat. No. 4,332,839 to Levinstein et al. and U.S. Pat. No. 4,337,476 to Fraser et al., which show a silicide layer interposed between a layer of polysilicon and a thermally grown layer of silicon dioxide; and U.S. Pat. No. 4,450,620 to Fuls et al., which shows an MOS integrated circuit device having both silicide and polysilicon layers.

One problem noted in the fabrication of polycide structures is poor adhesion of the silicide layer, both during silicide formation and in subsequent fabrication processes. During silicide formation, volume shrinkage can result in large tensile stresses in the range of $1-3 \times 10^{10}$ dynes per square cm. Because the coefficients of thermal expansion for silicides and polysilicon differ substantially, the high temperatures used in subsequent fabrication processes such as annealing can cause additional stress. Furthermore, cracking and delamination can occur during etching as well.

One proposed solution to the problem is the use of dual target sputtering in silicide formation, where both the silicide and the silicon targets are subjected to the same sputtering conditions. Such a system is shown, for example, in U.S. Pat. No. 4,443,930 to Hwang et al. While this system is effective in reducing tensile stress during formation of silicide, cracking and delamination can nevertheless occur in later fabrication processes. The solution proposed by the method of this invention addresses this latter problem, and relates to ion implantation of the silicide layer as a stress reduction technique.

Ion implantation offers a number of advantages as a method of introducing impurities into a host material. Among these advantages are: (1) precise control over the number of impurities implanted; (2) low temperature operation; (3) complete introduction of impurities below the host surface; and (4) control over the depth of implantation. The use of ion implantation as a method of doping silicon during device fabrication is well known. U.S. Pat. No. 4,373,251 to Wilting, for example, shows a polycide structure having a polysilicon layer doped by means of ion implantation. U.S. Pat. No. 4,450,620 to Fuls et al. similarly shows the use of ion implantation to dope the polysilicon layer of a polycide structure. The use of ion implantation to dope silicide and thereby reduce tensile stress and corresponding cracking and delamination problems is, however, novel.

SUMMARY OF THE INVENTION

Accordingly, it is an object of the present invention to provide a method of reducing tensile stress during integrated circuit fabrication.

It is another object of the invention to provide a method of improving film adhesion during the fabrication of thin film integrated circuit structures.

It is still another object of the invention to provide a method of reducing tensile stress and thereby improving film adhesion in thin film integrated circuit structures having a silicide layer.

It is a further object of the invention to reduce tensile stress and thus improve film adhesion in a thin film integrated circuit structure having a silicide layer by implanting selected ions of predetermined energy and at a predetermined dose into the silicide layer of such a structure, such that the likelihood of cracking and delamination during fabrication processes is substantially reduced.

Additional objects, advantages and novel features of the invention will be set forth in part in the description which follows, and in part will become apparent to those skilled in the art on examination of the following.

To achieve the foregoing and other objects, and in accordance with the purpose of the present invention, the method comprises depositing a metallic silicide on a substrate and then implanting the silicide layer with selected ions at a predetermined energy and at a predetermined dose. In one aspect of the invention, a refractory metal silicide is deposited on a substrate having a polysilicon surface layer and then implanted with either phosphorus, arsenic or boron at energies ranging from 0 to 300 keV and at a dose of from about $10^{15}$ to about $10^{17}$ cm$^{-2}$. The silicide is preferably a silicon-rich silicide of the formula MSi$_x$, where M is a refractory metal such as tungsten, titanium, tantalum or molybdenum, and x is greater than 2.

In a further aspect of the present invention, the silicide layer is implanted with selected ions such as phosphorus, arsenic or boron at energies ranging from 40 to 150 keV and at a dose of from about $5 \times 10^{15}$ to about $3 \times 10^{16}$ cm$^{-2}$. The method of this invention as described herein substantially reduces the tensile stress and corresponding cracking and delamination problems normally associated with heat treatment and other fabrication processes.

BRIEF DESCRIPTION OF THE DRAWINGS

FIG. 1 is a cross-sectional representation of a semiconductor element partially formed;

FIG. 2 shows the same element of FIG. 1 after further processing;

FIG. 3 shows the semiconductor element of FIGS. 1 and 2 after yet further processing steps have been performed; and FIG. 4 is a schematic representation of a common ion implantation apparatus.

DETAILED DESCRIPTION OF THE INVENTION

Referring to FIGS. 1 and 2, a known technique for forming polycide conductors is described. The example given is the formation of a metal-oxide-silicon (MOS) field effect transistor (FET). A silicon semiconductor substrate 11 initially has thick field oxide (FOX) thermally grown in all areas other than where active devices are to be formed. This field oxide is usually grown after those same areas are doped to isolate the active devices from one another. The ionization may be done by implanting boron ions in such regions. The top surface of the wafer 11 is initially flat but growth of the field oxide layers 13 consumes a layer of silicon at the top surface, thus forming the depressed regions shown in FIG. 1.

The next step in standard integrated circuit formation techniques is to grow a thin layer 15 of very high quality silicon dioxide over the wafer surface. This oxide layer will serve as the gate oxide of the active devices.

Next, a layer 17 of polysilicon is formed by standard techniques over the entire surface of the wafer. Next, a layer 19 of a refractory metal silicide is formed in a known manner, preferbly by sputtering. The silicide layer 19 may be any one of a number of specific compounds satisfying the formula MSi$_x$, where x ranges from about 2.2 to about 2.6, and M is a metal selected from the group consisting of tantalum, tungsten, titanium, molybdenum and mixtures thereof. The wafer is then annealed at a temperature greater than about 800 degrees Centigrade for at least 5 minutes. Preferred temperatures range from about 900 degrees to 950 degrees Centigrade, and preferred times from about 10 to 30 minutes.

After the silicide layer 19 is deposited, selected ions of predetermined energy are implanted into the layer at a predetermined dose. It is this implantation step which is the subject of the improved technique of the present invention. FIG. 4 shows a commonly known commercial ion implantation system. Gas source 29 houses an appropriate gas 31 maintained at an accelerating potential V. A boron-containing gas such as BF$_3$ is used in boron implantation, and, correspondingly, an arsenic-containing compound such as AsH$_3$ is used in the implantation of arsenic. Gas 31 is introduced into ion source 37 by means of adjustable valve 33. Ion source 37 thus contains an ionic plasma of the selected species, at pressures of approximately $10^{-3}$ torr, and is energized by ion source power supply 35 which maintains the source at a high potential. Source diffusion pump 39 establishes lower pressures for transport of the ion beam 43 through column 41. Focussing magnet 45 selects the ionic species of interest which beam then passes through resolving slit 49 and into accelerator tube 51.

Ion beam 43 is then scanned and directed by vertically positioned deflection plates 53 and by horizontally positioned deflection plates 55 such that a uniform implantation is achieved. Beam-line and end-station diffusion pumps 57 and 59 maintain a low pressure so that charge-exchange effects are avoided. Faraday cage 63 houses wafer target 65, into which ion beam 43 is finally directed. A target feeder 67 to replace implanted targets is optional.

Preferred ionic species for implantation include phosphorus, arsenic and boron at energies ranging from about 1 to 300 keV and more preferably from about 40 to 150 keV. Preferred doses range from about $10^{15}$ to $10^{17}$ cm$^{-2}$, and especially preferred doses range from about $5 \times 10^{15}$ to $3 \times 10^{16}$ cm$^{-2}$.

After implantation of silicide layer 19, that layer and the polysilicon 17 are removed from all areas of the wafer where conductors or gates are not to be permanently formed. The layers 17 and 19 are removed in unwanted areas by the use of standard photoresist masking and etching techniques. As shown in FIG. 2, this leaves a polycide gate structure formed of the layer 17' of polysilicon and layer 19' of selected metal silicide.

The total thickness is preferably approximately 4500 angstroms with the polysilicon layer 17' being approximately 2000 angstroms of that total thickness. This provides enough polysilicon for the necessary gate function and enough silicide for the necessary low resistivity conductivity for connecting that gate with other areas of the integrated circuit chip being formed.

Source and drain regions 21 and 23 (FIG. 2) are usually formed at this point by an ion implantation technique similar to that described above. In the example being described, an NMOS process, N+ regions are formed as shown.

After the intermediate structure of FIG. 2 is formed, it is desired to cover the entire wafer with an insulating layer, usually silicon dioxide. This is to provide protection to the device as formed in a silicon wafer substrate 11, and also to allow conductors to be formed over this insulating layer without substantially interfering electrically with the devices formed in the substrate below. Accordingly, as shown in FIG. 3, layers 25 and 27 of silicon dioxide are formed. The layer 25 is thin, usually around 1000 angstroms, and is of very high quality. The thicker layer 27 is most conveniently formed by standard chemical vapor deposition (CVD) techniques. But since the quality of the CVD-deposited dioxide is not good enough, the initial layer 25 is formed. The wafer is then annealed at a temperature greater than about 800 degrees Centigrade for at least 5 minutes. Preferred temperatures range from about 900 degrees to 950 degrees Centigrade, and preferred times from about 10 to 30 minutes.

For most of the wafer surface, the layer 25 is easily formed on top of previously formed gate oxide layer 15 but the oxide layer 25 also needs to be grown over the metal silicide layer 19' that is part of the gate electrode. The layer 25 is formed by oxidation at temperatures of at least 800 degrees Centigrade, and preferably at temperatures between about 900 and 950 degrees Centigrade.

The following examples illustrate certain embodiments of the present invention, and are not intended to limit the scope of the invention as defined in the appended claims.

EXAMPLE 1

Stress measurements were made on ion-implanted polycide wafers as follows. Silicon-rich tungsten disilicide ($WSi_x$, where x was about 2.3) was first sputter-deposited on substrates having a polysilicon surface layer, using a conventional dual-target sputtering-gun deposition system. Silicon was deposited at 1200 W, while tungsten was deposited at 300 W, over a period of about 26 minutes. The silicide layers were then implanted with either phosphorus or arsenic, using a Varian-Extrion DF-3000 ion implant system. Several different doses and energies were tested. After implantation, wafers were annealed at 950 degrees Centigrade in a dry nitrogen atmosphere for approximately 30 minutes. Results of stress measurements made after silicide deposition, implantation and annealing may be seen in Tables 1 and 2.

As illustrated by Tables 1 and 2, ion implantation of silicide films can substantially reduce the tensile stress normally encountered both during formation and after annealing.

TABLE 1

PHOSPHORUS IMPLANTATION

| | | Film Stress, dynes/cm$^{2*}$ | | |
|---|---|---|---|---|
| Energy, keV | Dose, cm$^{-2}$ | After Silicide Deposition | After Implantation | After Anneal |
| 80 | 0 | $0.05 \times 10^{10}$ | $0.50 \times 10^{10}$ | $0.95 \times 10^{10}$ |
| | $5 \times 10^{15}$ | $0.02 \times 10^{10}$ | $-0.95 \times 10^{10}$ | $-0.90 \times 10^{10}$ |
| | $1 \times 10^{16}$ | $0.15 \times 10^{10}$ | $-0.55 \times 10^{10}$ | $-0.92 \times 10^{10}$ |
| | $3 \times 10^{16}$ | $-0.33 \times 10^{10}$ | $-0.85 \times 10^{10}$ | $-1.05 \times 10^{10}$ |
| 100 | 0 | $0.03 \times 10^{10}$ | $0.50 \times 10^{10}$ | $0.93 \times 10^{10}$ |
| | $5 \times 10^{15}$ | $-0.15 \times 10^{10}$ | $-0.65 \times 10^{10}$ | $-0.70 \times 10^{10}$ |
| | $1 \times 10^{16}$ | $0.10 \times 10^{10}$ | $-0.35 \times 10^{10}$ | $-0.72 \times 10^{10}$ |
| | $3 \times 10^{16}$ | $0.15 \times 10^{10}$ | $0.13 \times 10^{10}$ | $-0.60 \times 10^{10}$ |
| 130 | 0 | $0.03 \times 10^{10}$ | $0.47 \times 10^{10}$ | $0.94 \times 10^{10}$ |
| | $5 \times 10^{15}$ | $0.10 \times 10^{10}$ | $-0.80 \times 10^{10}$ | $-0.95 \times 10^{10}$ |
| | $1 \times 10^{16}$ | $0.15 \times 10^{10}$ | $-0.70 \times 10^{10}$ | $-0.65 \times 10^{10}$ |
| | $3 \times 10^{16}$ | $0.07 \times 10^{10}$ | $-0.10 \times 10^{10}$ | $-0.55 \times 10^{10}$ |

*+ = tensile stress
− = compressive stress

TABLE 2

ARSENIC IMPLANTATION

| | | Film Stress, dynes/cm$^2$ | | |
|---|---|---|---|---|
| Energy, keV | Dose, cm$^{-2}$ | After Silicide Deposition | After Implantation | After Anneal |
| 80 | 0 | $0.02 \times 10^{10}$ | $0.47 \times 10^{10}$ | $0.95 \times 10^{10}$ |
| | $5 \times 10^{15}$ | $0.17 \times 10^{10}$ | $-0.43 \times 10^{10}$ | $-0.77 \times 10^{10}$ |
| | $1 \times 10^{16}$ | $0.08 \times 10^{10}$ | $-0.10 \times 10^{10}$ | $-1.05 \times 10^{10}$ |
| | $3 \times 10^{16}$ | $-0.15 \times 10^{10}$ | $-2.10 \times 10^{10}$ | $-2.50 \times 10^{10}$ |
| 100 | 0 | $0.04 \times 10^{10}$ | $0.50 \times 10^{10}$ | $0.95 \times 10^{10}$ |
| | $5 \times 10^{15}$ | 0 | $-0.24 \times 10^{10}$ | $-0.65 \times 10^{10}$ |
| | $1 \times 10^{16}$ | 0 | $-0.55 \times 10^{10}$ | $-1.00 \times 10^{10}$ |
| | $3 \times 10^{16}$ | $0.15 \times 10^{10}$ | $0.60 \times 10^{10}$ | $-0.70 \times 10^{10}$ |
| 130 | 0 | 0 | $0.48 \times 10^{10}$ | $0.95 \times 10^{10}$ |
| | $5 \times 10^{15}$ | 0 | $-0.38 \times 10^{10}$ | $-0.58 \times 10^{10}$ |
| | $1 \times 10^{16}$ | 0 | $-0.65 \times 10^{10}$ | $-0.93 \times 10^{10}$ |
| | $3 \times 10^{16}$ | 0 | $-1.70 \times 10^{10}$ | $-2.65 \times 10^{10}$ |

I claim:

1. A method of improving film adhesion between polysilicon and metallic silicide layers during the fabrication of thin film integrated circuits, comprising the steps of:
   providing a substrate having a polycrystalline silicon surface layer;
   depositing a metallic silicide film on said substrate;
   implanting in said silicide film a predetermined dose of selected ions at a predetermined energy; and
   maintaining said implanted ions in said silicide film during subsequent processing steps, whereby during subsequent heat treatment tensile stress in said silicide film is reduced.

2. The method of claim 1, wherein said metallic silicide is a compound of the structure $MSi_x$, where M is a refractory metal and x is greater than 2.

3. The method of claim 1, wherein said ions are selected from the group consisting of phosphorus, arsenic and boron.

4. The method of claim 1, wherein said dose ranges from $10^{15}$ to $10^{17}$ cm$^{-2}$.

5. The method of claim 1, wherein said ionic energy ranges from 0 to 300 keV.

6. The method of claim 1, wherein said heat treatment comprises maintaining said substrates at temperatures greater than 800 degrees Centigrade.

7. The method of claim 2, wherein M is selected from the group consisting of tungsten, titanium, tantalum and molybdenum, and x ranges from about 2.2 to about 2.6.

8. The method of claim 4, wherein said dose ranges from $5 \times 10^{15}$ to $3 \times 10^{16}$ cm$^{-2}$.

9. The method of claim 5, wherein said ionic energy ranges from 40 to 150 keV.

* * * * *